US 11,715,678 B2

(12) United States Patent
Tea et al.

(10) Patent No.: US 11,715,678 B2
(45) Date of Patent: Aug. 1, 2023

(54) ROUGHENED CONDUCTIVE COMPONENTS

(71) Applicant: TEXAS INSTRUMENTS INCORPORATED, Dallas, TX (US)

(72) Inventors: Yee Gin Tea, Bukit Katil (MY); Chong Han Lim, Seri Kembangan (MY)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/157,557

(22) Filed: Jan. 25, 2021

(65) Prior Publication Data
US 2022/0208659 A1 Jun. 30, 2022

Related U.S. Application Data

(60) Provisional application No. 63/133,087, filed on Dec. 31, 2020.

(51) Int. Cl.
*H01L 23/495* (2006.01)
*H01L 21/48* (2006.01)
(Continued)

(52) U.S. Cl.
CPC .... *H01L 23/49548* (2013.01); *H01L 21/4825* (2013.01); *H01L 21/4828* (2013.01); *H01L 21/565* (2013.01); *H01L 23/3107* (2013.01); *H01L 23/3114* (2013.01); *H01L 23/4952* (2013.01); *H01L 23/49503* (2013.01); (Continued)

(58) Field of Classification Search
CPC ..... H01L 24/29; H01L 24/85; H01L 24/2924; H01L 24/181; H01L 23/49548; H01L 23/3114; H01L 23/49513; H01L 23/4952; H01L 23/49582; H01L 23/49503; H01L 21/4825; H01L 21/4848; H01L 21/565; H01L 23/3107; H01L 24/06; H01L 23/49541
See application file for complete search history.

(56) References Cited

U.S. PATENT DOCUMENTS 5,277,356 A * 1/1994 Kawauchi ........... H01L 21/4825
228/180.5
5,315,152 A * 5/1994 Kuse ................. H01L 23/49579
257/E23.056
(Continued)

FOREIGN PATENT DOCUMENTS

| JP | 2015149370 A | * | 8/2015 |
| JP | 2017055044 A | * | 3/2017 |
| JP | 2018107360 A | * | 7/2018 |

*Primary Examiner* — Alonzo Chambliss
(74) *Attorney, Agent, or Firm* — Yudong Kim; Frank D. Cimino

(57) ABSTRACT

In some examples, a semiconductor package comprises a die pad, a semiconductor die on the die pad, and a mold compound covering the die pad and the semiconductor die. The semiconductor package includes a conductive component including a roughened surface, the roughened surface having a roughness ranging from an arithmetic mean surface height (SA) of 1.4 to 3.2. The mold compound is coupled to the roughened surface. The semiconductor package includes a bond wire coupling the semiconductor die to the roughened surface. The bond wire is directly coupled to the roughened surface without a precious metal positioned therebetween.

20 Claims, 13 Drawing Sheets

(51) Int. Cl.
    H01L 21/56    (2006.01)
    H01L 23/31    (2006.01)
    H01L 23/00    (2006.01)
(52) U.S. Cl.
    CPC .. *H01L 23/49513* (2013.01); *H01L 23/49541* (2013.01); *H01L 23/49582* (2013.01); *H01L 24/06* (2013.01); *H01L 2924/181* (2013.01)

(56) References Cited

U.S. PATENT DOCUMENTS

| | | | | |
|---|---|---|---|---|
| 6,197,615 B1 * | 3/2001 | Song | ........................ | H01L 24/32 257/E23.037 |
| 7,049,683 B1 * | 5/2006 | Sirinorakul | ............. | H01L 24/48 257/667 |
| 7,808,089 B2 * | 10/2010 | Nguyen | ............ | H01L 23/49503 257/667 |
| 8,240,446 B2 * | 8/2012 | Szuba | .................... | F16D 13/683 192/112 |
| 8,739,401 B2 * | 6/2014 | Shimazaki | ............ | H01L 21/568 29/846 |
| 9,679,832 B1 * | 6/2017 | Heng | ................. | H01L 23/49513 |
| 9,793,194 B2 * | 10/2017 | Hayashi | .............. | H01L 21/4828 |
| 9,831,158 B2 * | 11/2017 | Hayashi | .............. | H01L 23/3114 |
| 9,984,958 B2 * | 5/2018 | Hayashi | ............ | H01L 23/49582 |
| 10,727,146 B2 * | 7/2020 | Take | .................... | H01L 23/3121 |
| 2009/0039486 A1 * | 2/2009 | Shimazaki | ............. | H01L 21/565 29/829 |
| 2009/0146280 A1 * | 6/2009 | Shimazaki | ........ | H01L 23/49548 257/676 |
| 2010/0258922 A1 * | 10/2010 | Nakamura | .............. | H01L 24/32 257/676 |
| 2013/0307000 A1 * | 11/2013 | Ikenaga | ................ | H01L 33/486 257/91 |
| 2014/0001620 A1 * | 1/2014 | Shimizu | ............ | H01L 23/49551 257/676 |
| 2015/0380342 A1 * | 12/2015 | Kashiwazaki | .......... | H01L 24/32 438/123 |

* cited by examiner

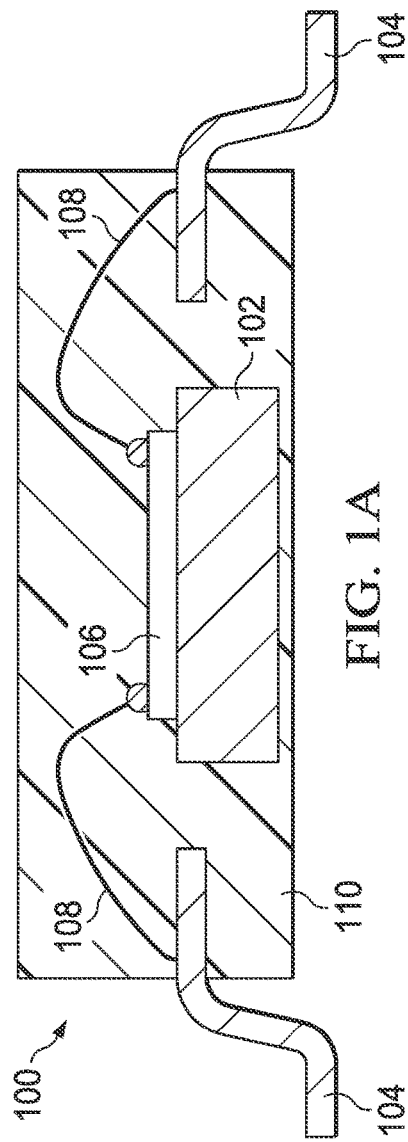
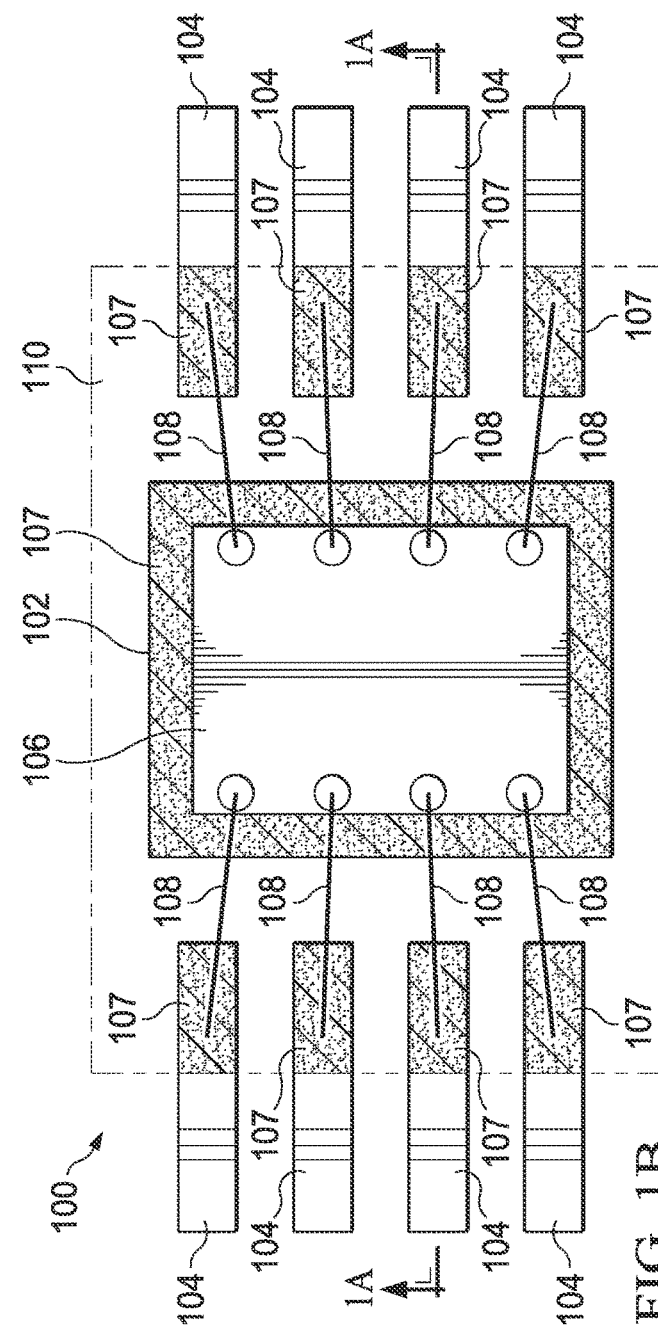

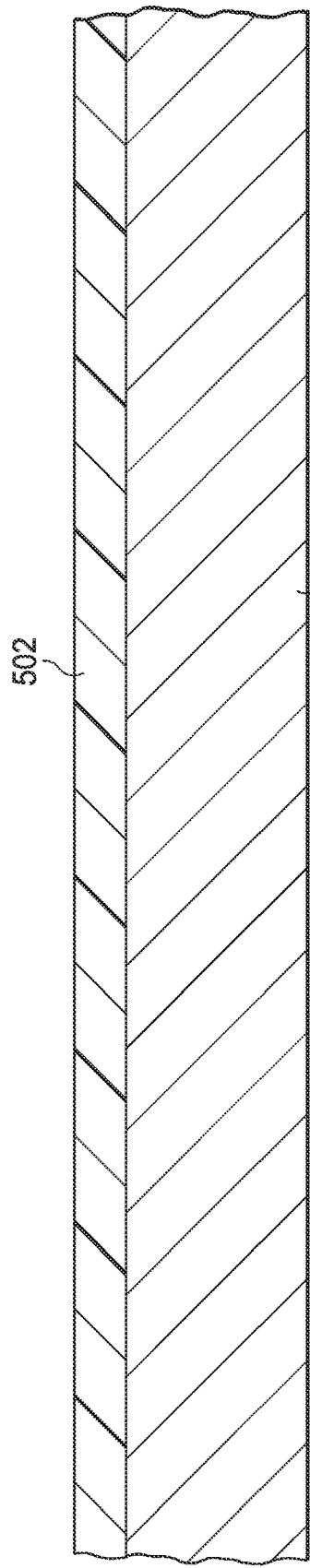
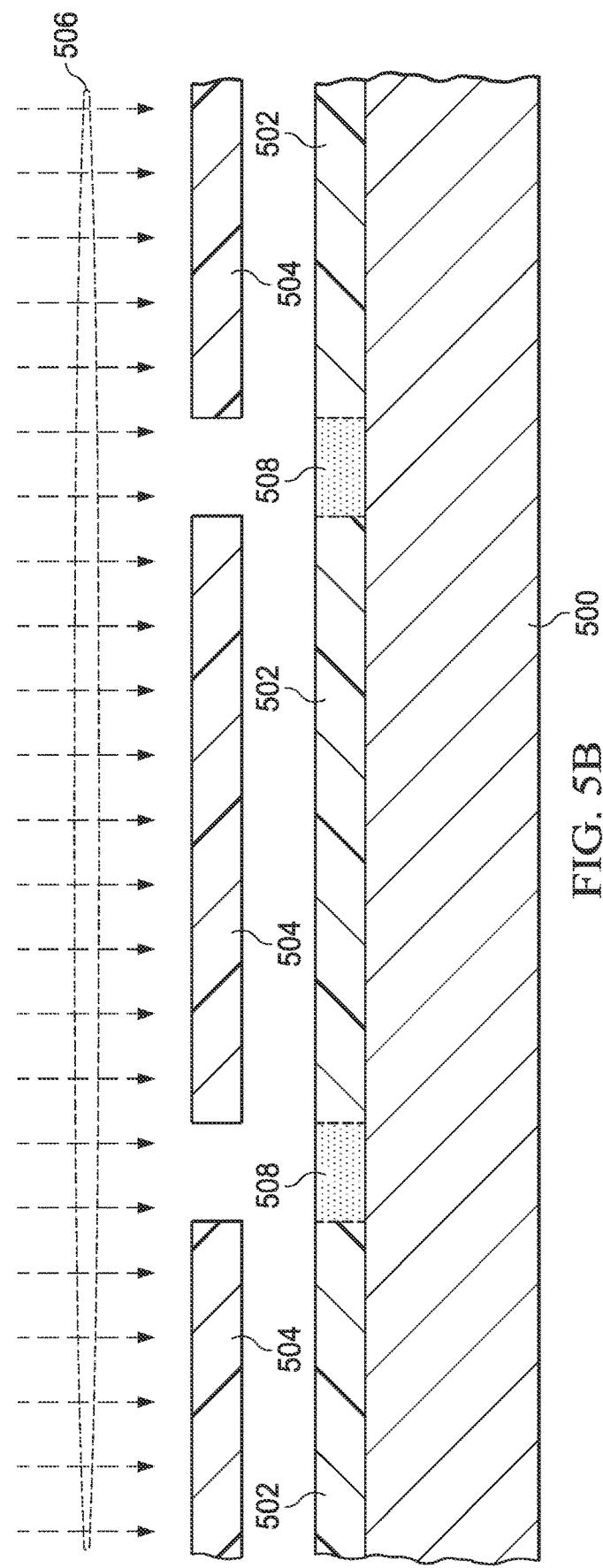
FIG. 5A
FIG. 5B

ROUGHENED CONDUCTIVE COMPONENTS

CROSS-REFERENCE TO RELATED APPLICATIONS

The present application claims priority to U.S. Provisional Patent Application No. 63/133,087, which was filed Dec. 31, 2020, is titled "Roughened Conductive Components," and is hereby incorporated herein by reference in its entirety.

BACKGROUND

Semiconductor chips are often housed inside packages that protect the chips from deleterious environmental influences, such as heat, moisture, and debris. A packaged chip communicates with electronic devices outside the package via leads that are exposed to surfaces of the package. Within the package, the chip may be electrically coupled to the leads using any suitable technique. One such technique is wire bonding, in which one end of a conductive wire (also known as a bond wire) is coupled to a lead and the other end of the wire is coupled to the chip. In particular, the wire couples to the chip by coupling to a bond pad on the surface of the chip, e.g., on the surface of the semiconductor die on and in which a circuit has been formed.

SUMMARY

In some examples, a semiconductor package comprises a die pad, a semiconductor die on the die pad, and a mold compound covering the die pad and the semiconductor die. The semiconductor package includes a conductive component including a roughened surface, the roughened surface having a roughness ranging from an arithmetic mean surface height (SA) of 1.4 to 3.2. The mold compound is coupled to the roughened surface. The semiconductor package includes a bond wire coupling the semiconductor die to the roughened surface. The bond wire is directly coupled to the roughened surface without a precious metal positioned therebetween.

In some examples, a method for manufacturing a semiconductor package comprises coupling a semiconductor die to a die pad. The method also comprises coupling a bond wire to the semiconductor die and to a roughened surface of a conductive component using a thermosonic technique including: applying heat to the roughened surface to cause an anti-tarnish chemical coat abutting the roughened surface to decompose; causing the decomposed anti-tarnish chemical coat to slough off of the roughened surface using at least one of mechanical and ultrasonic energy; and causing the bond wire to adhere directly to the roughened surface without a precious metal positioned therebetween.

BRIEF DESCRIPTION OF THE DRAWINGS

FIGS. 1A, 1B, and 1C are profile cross-sectional, top-down, and perspective views, respectively, of a semiconductor package having conductive components with roughened surfaces, in accordance with various examples.

FIGS. 5A-5G are a process flow for manufacturing conductive components having roughened surfaces, in accordance with various examples.

DETAILED DESCRIPTION

Figure 1C:
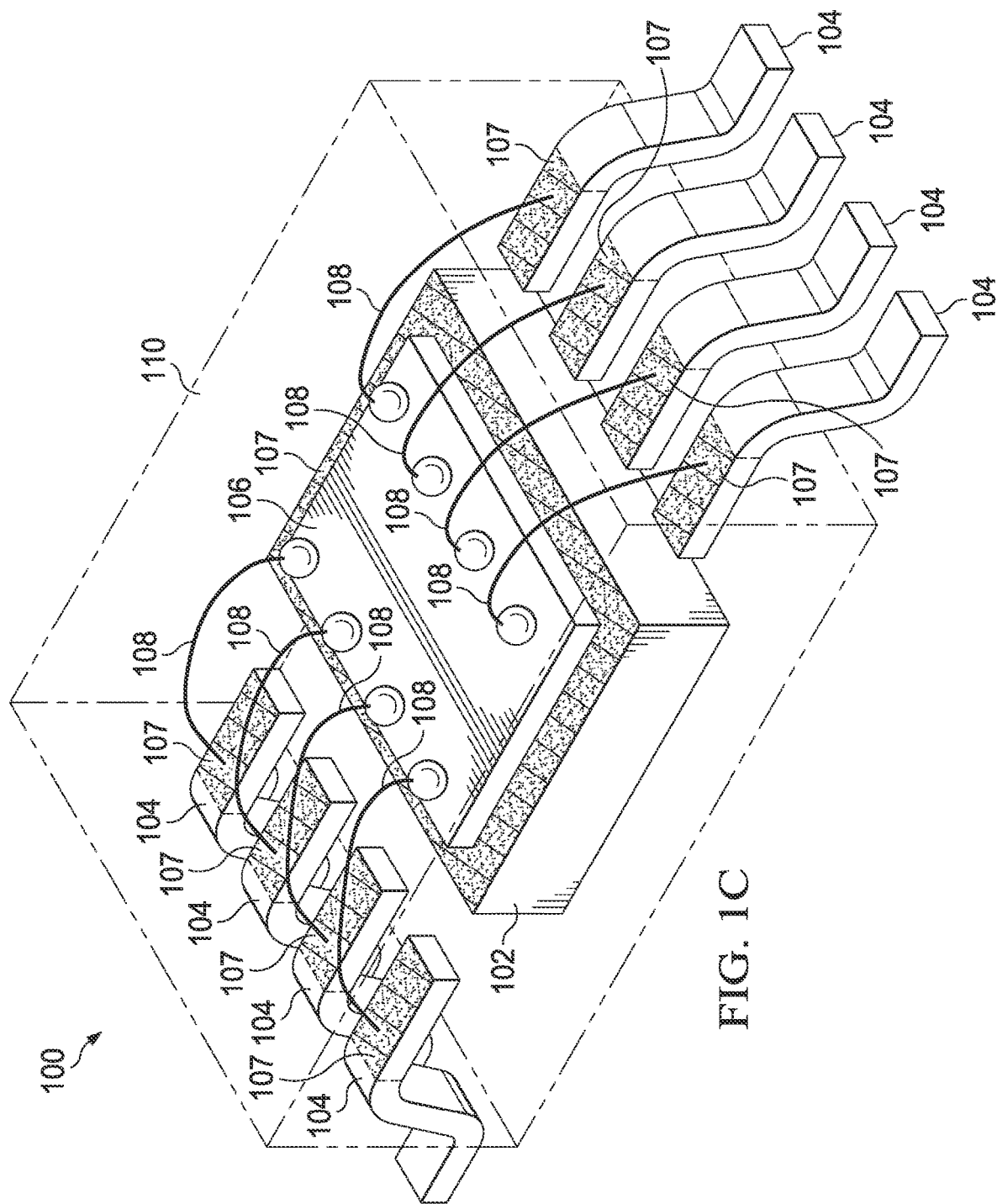

As described above, packaged dies are sometimes coupled to package leads using a wire bonding technique. While bond wires are generally useful in exchanging electrical signals between dies and leads, the connection between the bond wire and the lead is often weak and thus is susceptible to detachment. Similarly, the connection between the lead and a mold compound covering the various components of the semiconductor package may be susceptible to detachment, also known as delamination. Further, the leads are often composed of copper, which is vulnerable to oxidation. Precious metals, which are defined herein as silver, gold, palladium, and alloys containing silver, gold, and/or palladium, are often plated on the copper leads to prevent oxidation, but such precious metals substantially increase costs.

This disclosure describes various examples of a semiconductor package conductive component (e.g., lead, die pad) that resolves the challenges described above. Specifically, the conductive component has a surface exposed to an interior of the semiconductor package. The surface has been roughened using, e.g., an etching technique or a plating technique. Bond wires (and, possibly, other components) are directly coupled to the roughened surface of the conductive component, without any precious metal plating positioned between the bond wires and the conductive component and without any precious metal plating positioned elsewhere on the conductive component. For example, a bond wire may be stitched directly to a roughened surface of a semiconductor package lead without any intervening precious metal plating. By omitting the precious metal plating from the semiconductor package, costs are substantially reduced. Although the precious metal plating used in other solutions is useful to prevent oxidation of the conductive component during the manufacturing process, it no longer serves a useful purpose post-manufacture, and thus omitting the precious metal plating from the semiconductor package reduces costs without negatively impacting the structural or functional integrity of the package.

In addition, in some examples, an anti-tarnish chemical coat (e.g., composed of benzotriazole (BTA) or an organic film) is applied to the roughened surface of the conductive component prior to the wirebonding process, thereby reducing the risk of oxidation (e.g., copper oxidation). The thermal, mechanical, and ultrasonic energy introduced by the wirebonding equipment in a thermosonic bonding process will decompose and dislodge the anti-tarnish chemical coat from the conductive components as the metal (e.g., copper) molecules between the grain boundaries of the bond wire and the roughened surface of the conductive component diffuse. The bond wire thus couples directly to the roughened surface of the conductive component, resulting in a strong mechanical connection. Various examples are now described with reference to the drawings.

FIG. 1A is a profile cross-sectional view of a semiconductor package 100 having roughened conductive components, in accordance with various examples. The semiconductor package 100 may be a dual-inline style package (DIP), for example. Other types of packages (e.g., quad flat no-lead (QFN) packages) are contemplated and included in the scope of this disclosure. In examples, the semiconductor package 100 includes a conductive component 102, such as a die pad. In examples, the semiconductor package 100 also includes conductive components 104, such as leads or pins. The semiconductor package 100 may also include a semiconductor die 106 having one or more circuits formed in and/or on the semiconductor die 106 and coupled to the conductive component 102 (e.g., using a die attach layer). The semiconductor die 106 couples to the conductive components 104 via bond wires 108. For example, the bond wires 108 may couple to the semiconductor die 106 (e.g., an active surface of the semiconductor die 106) using balls, and the bond wires 108 may couple to the conductive components 104 using a stitching technique, a crescent technique, or any other suitable technique. The semiconductor package 100 may further include a mold compound 110 that covers some or all of the components of the semiconductor package 100 described above.

In some examples, the conductive components 102, 104 comprise copper, or a copper-iron alloy (e.g., C194 alloy). Although not visible in FIG. 1A, the conductive components 102, 104 of the semiconductor package 100 may be roughened to include protrusions and/or orifices. In examples, the conductive components 102, 104 of the semiconductor package 100 were formerly covered by anti-tarnish chemical coats, e.g., chemical coats that mitigate oxidation (e.g., copper oxidation) of the conductive components 102, 104, particularly during high-heat wire-bonding processes that raise the risk of oxidation. In some examples, all portions of the top surface(s) of the conductive component(s) 102 and/or 104 are roughened. In some examples, fewer than all portions of the top surface(s) of the conductive component(s) 102 and/or 104 are roughened.

By roughening surfaces of the conductive components 102, 104, the available surface area of the conductive components 102, 104 is increased relative to the surface area that would otherwise be available. Accordingly, components of the semiconductor package 100 that may couple to the conductive components 102, 104, such as the bond wires 108 and the mold compound 110, form a relatively strong mechanical connection to the conductive components 102, 104, because they are at least partially positioned inside the orifices of the roughened surfaces of the conductive components 102, 104. In this way, the risk of delamination of the mold compound 110 and the risk of bond wires 108 becoming detached are mitigated. Moreover, such bond wire 108 connections are made directly to the roughened surfaces of the conductive components 102, 104 instead of to a precious metal plating, which not only increases mechanical connection strength but substantially reduces costs.

FIG. 1B is a top-down view of the semiconductor package 100. As shown in FIG. 1B, surfaces of the conductive components 102, 104 are roughened. More specifically, at least some of the top surfaces of the conductive components 102, 104 are roughened, as numeral 107 indicates. In some examples, the roughened areas of the conductive components 104 are limited to those portions inside the housing of the semiconductor package 100, e.g., those portions of the conductive components 104 covered by the mold compound 110. In other examples, the top surfaces of the conductive components 102 that are outside of the mold compound 110 are also roughened. FIG. 1C is a perspective view of the semiconductor package 100. As shown in FIGS. 1A-1C, precious metal platings have been omitted.

Figure 2A:
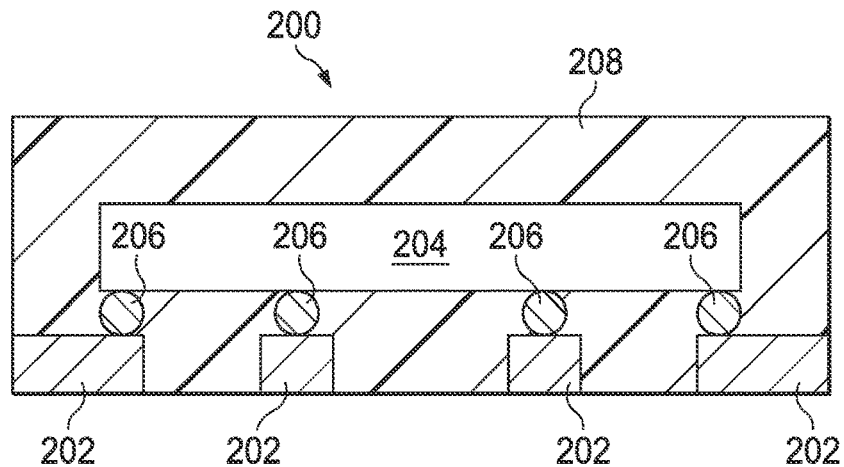
FIGS. 2A, 2B, and 2C are profile cross-sectional, top-down, and perspective views, respectively, of a semiconductor package having conductive components with roughened surfaces, in accordance with various examples.
Figure 2B:
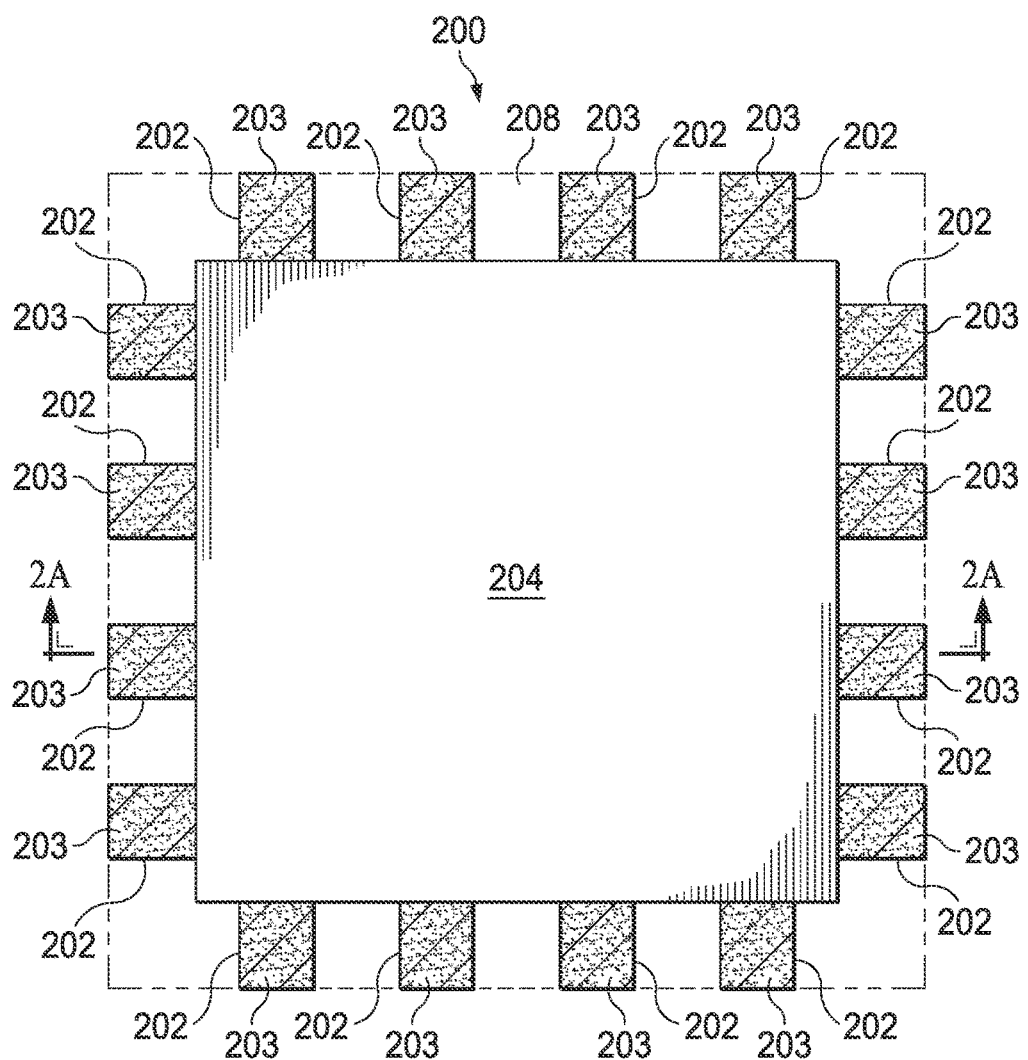
Figure 2C:
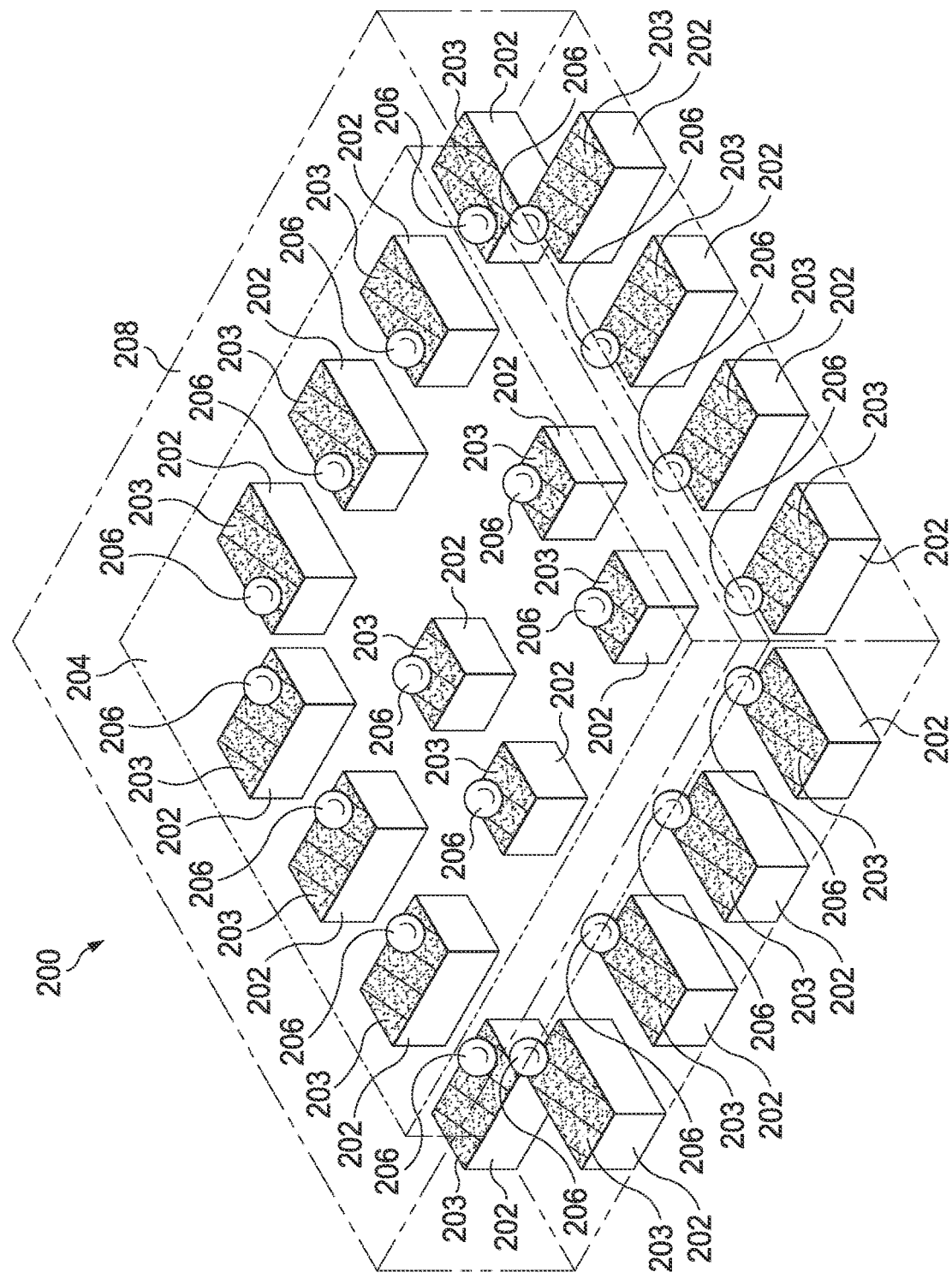

Roughened conductive components are not limited to application in DIP style semiconductor packages. Other types of semiconductor packages, such as quad flat no-lead (QFN) style packages and thin-shrink small-outline packages (TSSOP), are also contemplated. FIG. 2A is a profile cross-sectional view of a semiconductor package 200 having conductive components with roughened surfaces, in accordance with various examples. The semiconductor package 200 is a QFN style package. The semiconductor package 200 may include conductive components 202 (e.g., leads) and a semiconductor die 204 that couples to the conductive components 202 via solder balls 206 (or via other suitable connectors). A mold compound 208 covers the components of the semiconductor package 200. The semiconductor die 204 may have a circuit formed in and/or on the bottom surface of the semiconductor die 204 facing the solder balls 206. Although not visible in FIG. 2A, the conductive components 202 may include roughened surfaces and may omit precious metal plating. The description provided above for the roughened surfaces in FIGS. 1A-1C also applies to the roughened surfaces in FIGS. 2A-2C and thus is not repeated here. FIG. 2B is a top-down view of the semiconductor package 200 including roughened surfaces of the conductive components 202, as numeral 203 indicates. FIG. 2C is a perspective view of the semiconductor package 200.

Figure 3A:
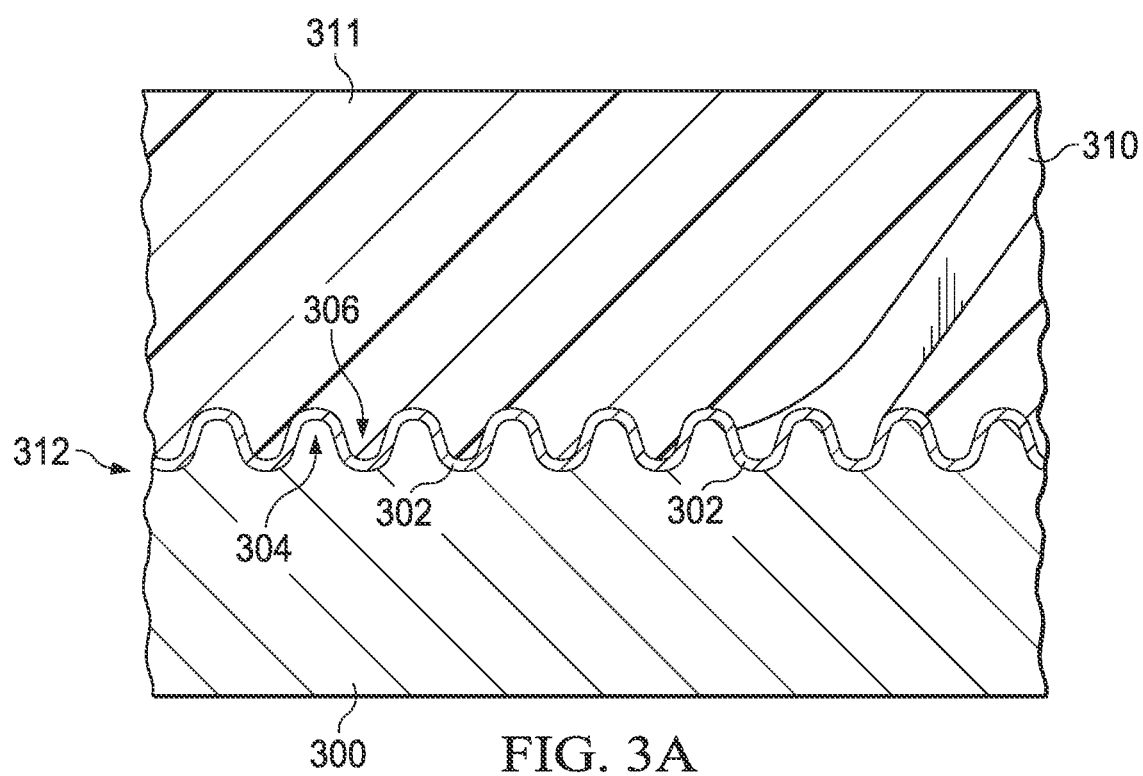
FIGS. 3A-3F are profile cross-sectional, top-down, and perspective views of conductive components having roughened surfaces, in accordance with various examples.

FIG. 3A is a profile cross-sectional view of a conductive component having a roughened surface, in accordance with various examples. The conductive component 300 is representative of the conductive components 102, 104, and 202 described above, as well as of other surfaces in semiconductor packages that may benefit from oxidation protection and/or enhanced mechanical connection to other components, such as bond wires, mold compounds, die attach layers, etc. In examples, the conductive component 300 comprises copper or a copper-iron alloy (e.g., a C194 alloy). The conductive component 300 includes a roughened surface 302. The roughened surface 302 may include a plurality of protrusions 304 and/or a plurality of orifices 306 in the conductive component 300. Although the protrusions 304 and orifices 306 are depicted as occurring in a regular pattern, in examples, the protrusions 304 and orifices 306 occur in an irregular or random pattern. A bond wire 310 couples directly to the roughened surface 302 rather than, for example, a precious metal plating. A mold compound 311 also couples to the roughened surface 302. Depending on the manner in which the conductive component 300 is implemented, other components may couple to the roughened surface 302, such as a die attach layer, solder balls, etc., with protrusions 304 and orifices 306 increasing mechanical connection strength with any such components by increasing the available surface area to which such components may couple.

The top surface of the conductive component 300 may be roughened to produce the roughened surface 302 using any suitable technique. In some examples, a chemical etchant is applied to roughen the top surface of the conductive component 300. The degree of roughness achieved on the top surface of the conductive component 300 may be controlled by adjusting the amount, type, chemical exposure time, and/or concentration of the chemical etchant applied. For instance, for a given chemical etchant, a greater volume of etchant may produce a rougher surface, with a lesser volume of chemical etchant producing a less rough surface. For instance, some etchants may be non-organic solutions containing peroxide and will typically produce a rougher surface, while etchants that are organic solutions containing peroxide will typically produce a less rough surface. The specific degrees of roughness that may be produced by each of these parameters varies, as the various parameters described above, as well as other parameters not expressly described herein, may act simultaneously to influence the degree of roughness that is attained.

In examples, the various parameters that may influence roughness are selected so that the degree of roughness realized on the top surface of the conductive component 300 (e.g., at the roughened surface 302) ranges from an arithmetic mean height of a surface (SA) of 1.4 to 3.2. Increased roughness provides increased surface area to strengthen mechanical connections between the roughened surface 302 and the mold compound 311 as well as between the roughened surface 302 and the bond wires 310, but excessive roughness that goes beyond a specific roughness range may negatively impact the ability to form wire bonds on the roughened surface 302, especially for fine-wire, low-diameter wire bonding. Conversely, a less rough roughened surface 302 provides less surface area for gripping the mold compound 311 and bond wires 310, but it may provide a wider wire bonding process window, permitting the formation of fine-wire, low-diameter wire bonds. Accordingly, balancing between high degrees of roughness (to improve bonding between the roughened surface 302 and the mold compound 311, as well as between the roughened surface 302 and bond wires 310) and low degrees of roughness (to improve the ability to establish different types of wire bonds, particularly fine-wire, low-diameter wire bonds) is critical. A roughness lower than the SA range provided above may produce an unacceptably low connection strength between the roughened surface 302 and the mold compound 311, while a roughness higher than the SA range provided above may produce an unacceptable wire bonding ability to the roughened surface 302, particularly for fine wire bonds. Other advantages and disadvantages contribute to the criticality of the SA range of 1.4 to 3.2. For example, within this range, significant packaging performance indices improve relative to SAs outside of this range. For instance, the moisture sensitivity level within the SA range of 1.4 to 3.2 improves to MSL1, whereas the moisture sensitivity level below 1.4 and above 3.2 declines to MSL2. In the semiconductor industry, an MSL of MSL1 is regarded as superior, and in many applications an MSL of MSL1 is required. Further, the process capability index (CPK) is at or above 1.67 in the SA range of 1.4 to 3.2, while the CPK falls to 1.66 or below outside of this SA range. In the semiconductor industry, a CPK of 1.66 or lower is recognized as indicating poor performance. Further still, the mean time between assist (MTBA) rises to or above 1 hour in the SA range of 1.4 to 3.2, and the MTBA falls below 1 hour outside of this range. In the semiconductor industry, a higher MTBA is generally regarded as superior, with an MTBA below 1 hour being a common indicator of poor performance. Other types of etching may be used in lieu of chemical etching to form the roughened surface 302. For purposes of the foregoing description, a bond wire diameter ranging from 0.8 mils to 2.0 mils is assumed.

Non-precious metal plating is an alternative technique for roughening the top surface of the conductive component 300, since plating produces uneven, rough surfaces. For example, the copper (or copper-iron alloy) top surface of the conductive component 300 may be electroplated with copper to form small copper nodules, thereby producing a rough surface. Other non-precious metals, such as brass, may be plated in lieu of copper, assuming that a suitable seed layer is first applied to the top surface of the conductive component 300. The degree of roughness produced by electroplating may be controlled by the degree of electric current applied and the concentration of electrolyte used. For instance, by increasing electric current and/or the concentration of electrolyte, roughness may be increased, and by decreasing electric current and/or the concentration of electrolyte, roughness may be decreased. In examples, metal plating produces a roughness of the top surface of the conductive component 300 ranging from an SA of 1.4 to an SA of 3.2. Example advantages and disadvantages that result from varying degrees of roughness are described above.

Figure 3B:
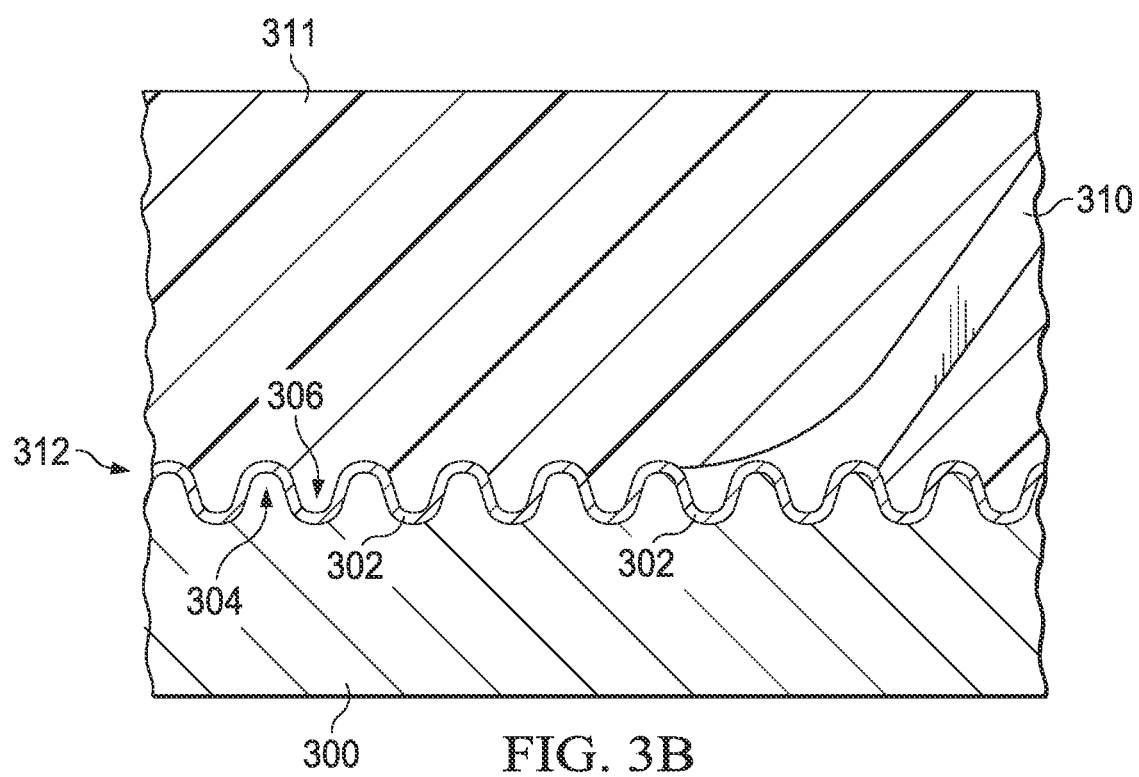

The roughened surface 302 of FIG. 3A includes protrusions 304 that extend above the original (e.g., prior to roughening) top surface 312 of the conductive component 300, meaning that an additive process, such as electroplating, is used to fabricate the roughened surface 302. FIG. 3B is another profile cross-sectional view of a roughened conductive component 300, in accordance with various examples. In contrast to the conductive component 300 of FIG. 3A, the conductive component 300 of FIG. 3B includes protrusions 304 that are approximately level with the original top surface 312 of the conductive component 300, meaning that a subtractive process, such as etching, is used to fabricate the orifices 306 in the roughened surface 302.

Figure 3C:
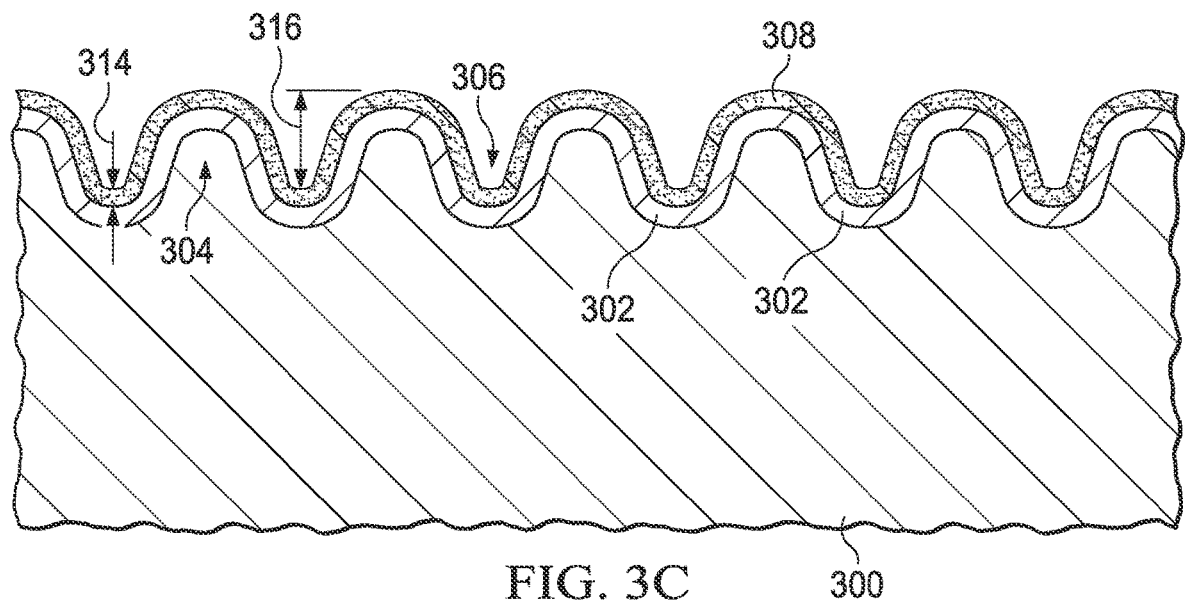

Irrespective of the technique by which the roughened surface 302 is formed, an anti-tarnish chemical coat 308 is subsequently applied to the roughened surface 302 prior to wirebonding, as shown in FIG. 3C. For instance, the anti-tarnish chemical coat 308 may be composed of a combination of organic and inorganic compounds, such as potassium sorbate, sodium dodecyl sulfate, or sodium molybdate, with benzotriazole. The anti-tarnish chemical coat 308 is composed of a material that mitigates or prevents oxidation and corrosion of the roughened surface 302 (e.g., which may be composed of copper or a copper-iron alloy, such as C194), particularly when the roughened surface 302 is exposed to high heat, such as during the wirebonding process. In at least some examples, the anti-tarnish chemical coat 308 does not include precious metals such as silver and palladium. In examples, the anti-tarnish chemical coat 308 is composed of a solvent base. To apply the anti-tarnish chemical coat 308 in liquid form, a film-forming polymer or mixture of polymers is dissolved or dispersed into a suitable liquid (e.g., water). The solution is then applied to the roughened surface 302, the solvent evaporates, and a thin coat—the anti-tarnish chemical coat 308—remains on the roughened surface 302. The anti-tarnish chemical coat 308 may be allowed to air-dry or may be cured. Curing temperatures may range up to 150 degrees C. in some examples. Temperatures exceeding this range, and in some cases, exceeding 200 degrees C., may cause the anti-tarnish chemical coat 308 to prematurely decompose.

Still referring to FIG. 3C, numeral 314 indicates the thickness of the anti-tarnish chemical coat 308, which, in some examples, ranges from 10 Angstroms to 50 nanometers. A thicker anti-tarnish chemical coat 308 beyond this range may be excessively expensive and produce diminishing returns, while a thinner anti-tarnish chemical coat 308 below this range may fail to adequately protect the underlying roughened surface 302 from oxidation. The anti-tarnish chemical coat 308 has a topography that follows the topography of the underlying roughened surface 302 (and, more generally, the topography of the conductive component 300), meaning that the anti-tarnish chemical coat 308 has protrusions that spatially coincide with protrusions 304 and that the anti-tarnish chemical coat 308 has orifices that spatially coincide with orifices 306. In examples, the thickness of the anti-tarnish chemical coat 308 is not so great that the topography of the anti-tarnish chemical coat 308 fails to follow the topography of the underlying roughened surface 302. In examples, the thickness of the anti-tarnish chemical coat 308 is not so great that the orifices 306 are mostly (e.g., over 75%) or completely filled by the anti-tarnish chemical coat 308.

Because the topography of the anti-tarnish chemical coat 308 follows the topography of the underlying roughened surface 302, the protrusions 304 and orifices 306 described herein may refer to protrusions and orifices in the roughened surface 302, the anti-tarnish chemical coat 308, or both. As explained above, in examples, the roughness of the roughened surface 302, and thus the roughness of the anti-tarnish chemical coat 308, ranges from an SA of 1.4 to an SA of 3.2. In examples, the depth 316 of the orifices 306 may range from an SA of 1.4 to an SA of 3.2 and may be a product of the roughness of the roughened surface 302 and/or the anti-tarnish chemical coat 308, with rougher surfaces producing deeper orifices 306 and vice versa. As shown, the numeral 316 indicates a depth of an example orifice 306 as measured from a crest of a protrusion 304 of the anti-tarnish chemical coat 308 to a nadir of an orifice 306 of the anti-tarnish chemical coat 308.

Figure 3D:
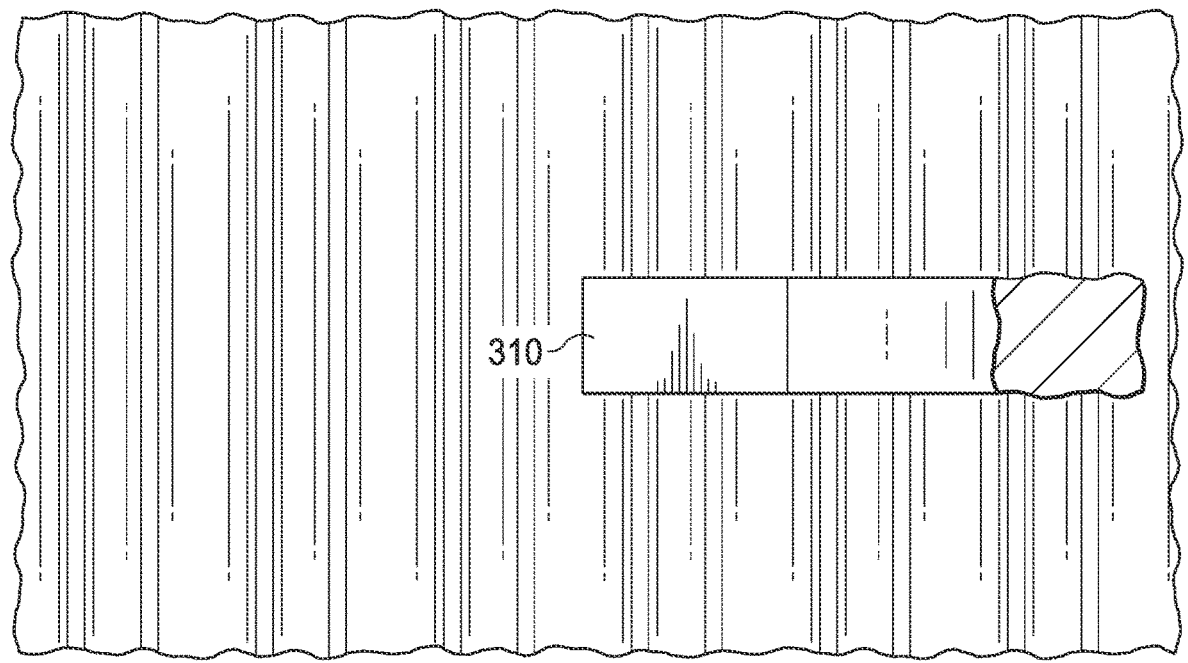
Figure 3E:
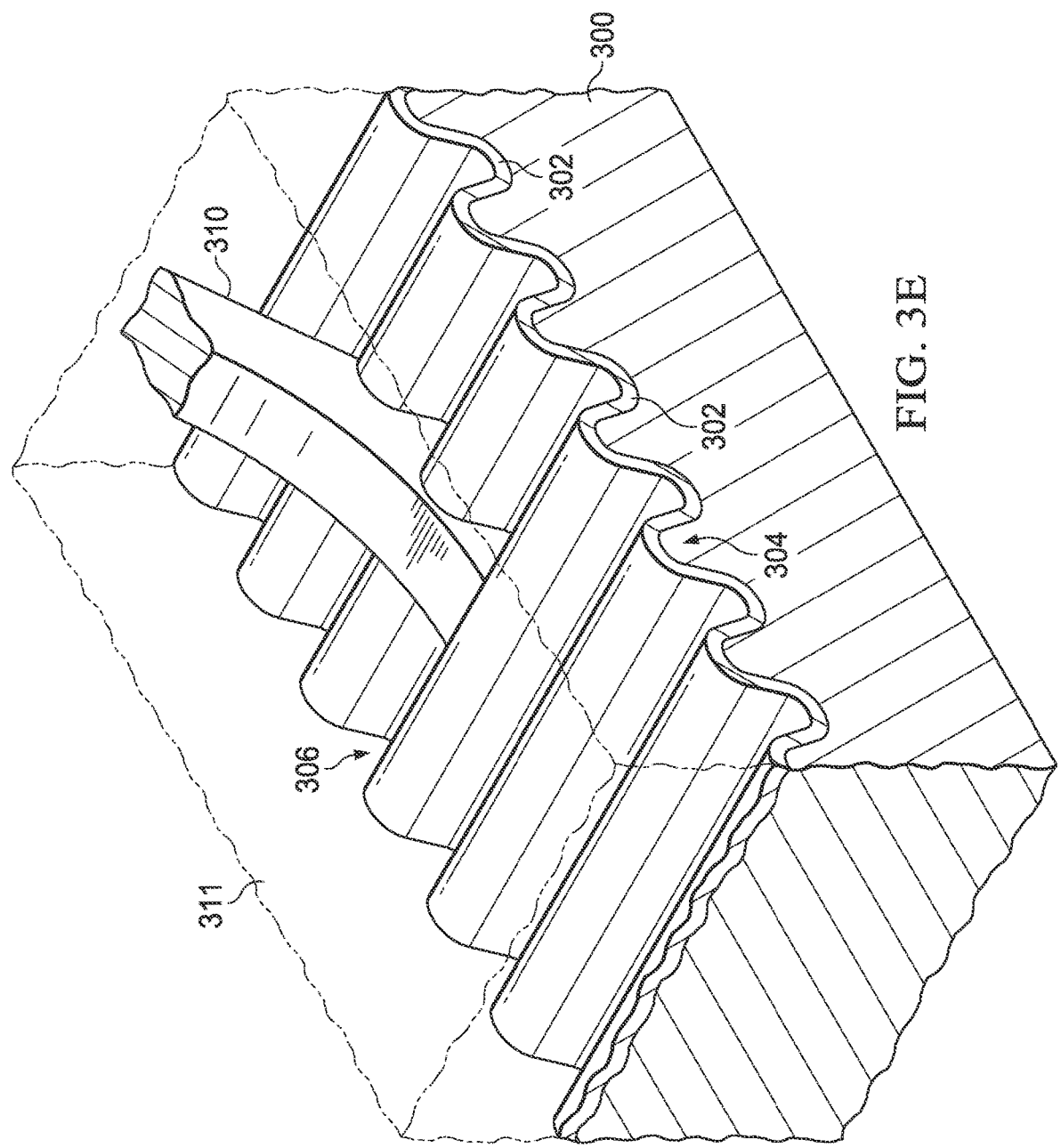

Referring to FIGS. 3A-3E, components that couple to the roughened surface 302, such as the bond wire 310 and the mold compound 311, may at least partially fill at least some of the orifices 306 and may at least partially cover at least some of the protrusions 304. For example, as shown in FIGS. 3A and 3B, the bond wire 310 fills orifices 306 and covers protrusions 304, thereby increasing the contact surface area between the bond wire 310 and the roughened surface 302 and increasing the strength of the mechanical connection between the bond wire 310 and the roughened surface 302. Similarly, as shown, the mold compound 311 fills orifices 306 and covers protrusions 304, thereby increasing the contact surface area between the mold compound 311 and the roughened surface 302 and increasing the strength of the mechanical connection between the mold compound 311 and the roughened surface 302. FIGS. 3D and 3E provide top-down and perspective views, respectively, of the structure of FIGS. 3A and 3B.

After the wirebonding process and mold compound application process are complete, the resulting structure may appear as shown in FIGS. 3A, 3B, 3D, and 3E. However, bond wires 310 and mold compound 311 are applied while the anti-tarnish chemical coat 308 is covering and protecting the roughened surface 302, as shown in FIG. 3C. The anti-tarnish chemical coat 308 protects the roughened surface 302 from oxidation prior to and at the beginning of the wirebonding process. As the wirebonding process begins, temperature rises and exceeds 200 degrees C., causing the anti-tarnish chemical coat 308 to decompose. When mechanical and ultrasonic energy is applied during the wirebonding process, the decomposed anti-tarnish chemical coat 308 sloughs off as the metal (e.g., copper) molecules between the grain boundaries of the bond wires 310 and the roughened surface 302 diffuse. The result is that the anti-tarnish chemical coat 308 is removed from the roughened surface 302, leaving a direct mechanical connection between the bond wires 310 and the roughened surface 302, and, after the mold compound is injected, between the mold compound 311 and the roughened surface 302.

Figure 3F:
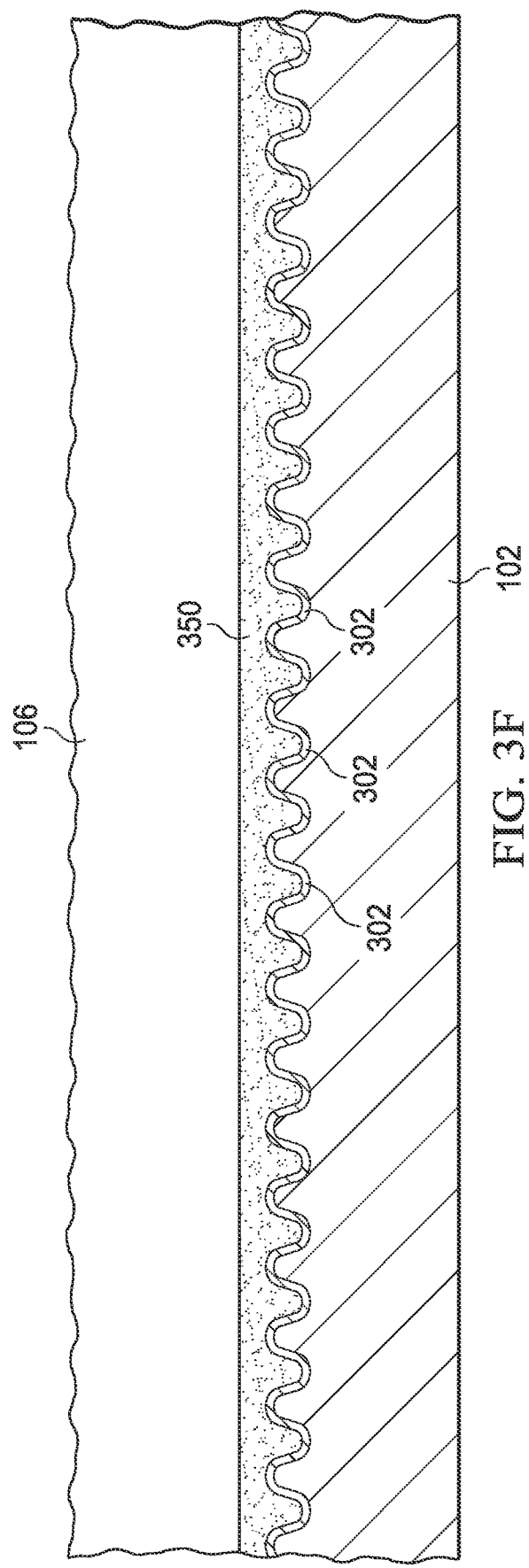

Components of semiconductor packages other than bond wires and mold compounds, such as die attach layers, also may benefit from such enhanced mechanical connection strength. FIG. 3F is a profile cross-sectional view of roughened conductive components covered by a die attach layer, in accordance with various examples. Specifically, FIG. 3F shows a die attach layer 350 coupling the semiconductor die 106 to the roughened surface 302. Because the roughened surface 302 includes protrusions and orifices and thus a greater surface area than would otherwise be the case, the die attach layer 350 forms a stronger mechanical connection to the conductive component 102 (e.g., die pad) than would otherwise be the case.

Figure 4:
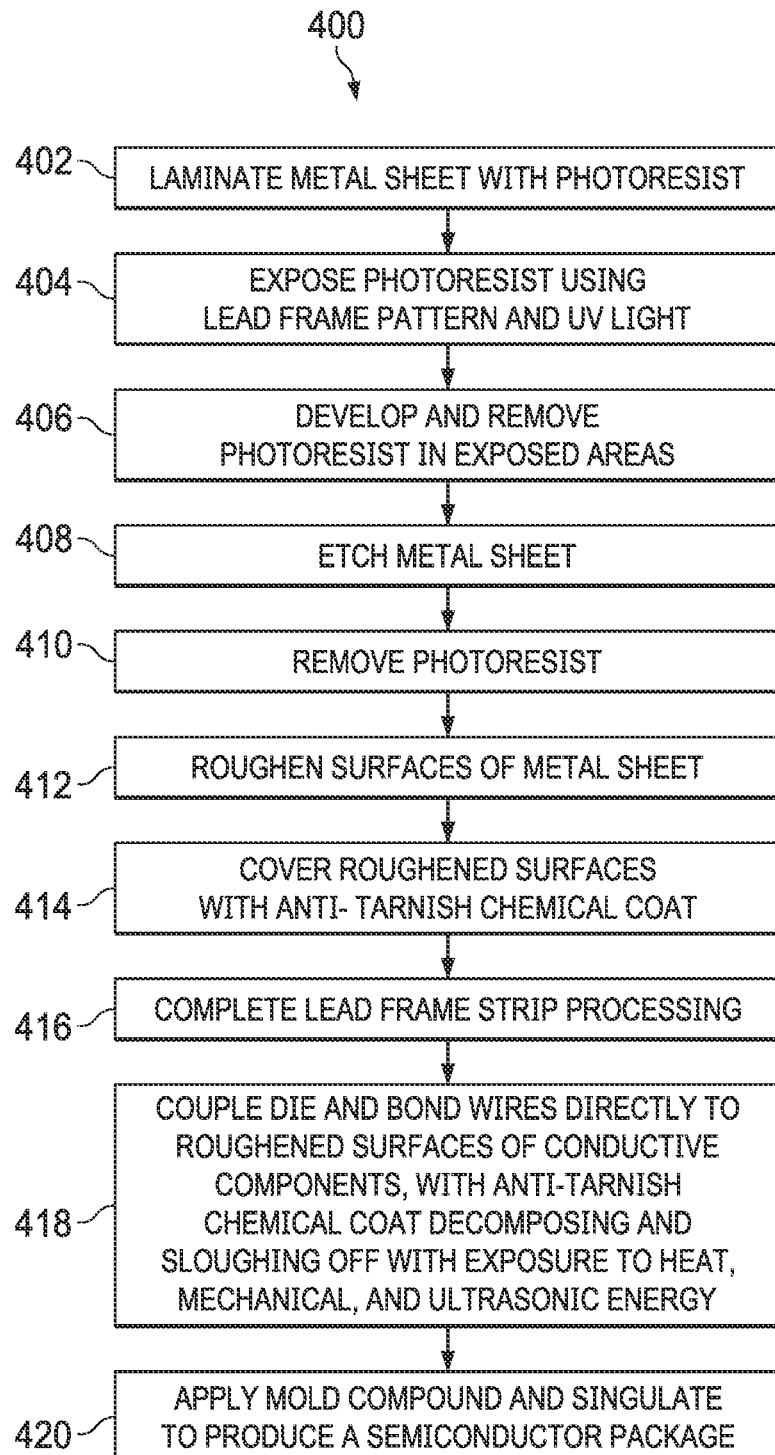
FIG. 4 is a flow diagram of a method for manufacturing semiconductor packages having conductive components with roughened surfaces, in accordance with various examples.

FIG. 4 is a flow diagram of a method 400 for manufacturing roughened conductive components, in accordance with various examples. FIGS. 5A-5G are a process flow for manufacturing roughened conductive components, in accordance with various examples. Accordingly, FIGS. 4 and 5A-5G are now described in parallel.

The method 400 includes laminating a metal sheet with photoresist (402). FIG. 5A depicts a metal sheet 500, such as a copper sheet or a copper-iron alloy (e.g., C194), and a photoresist layer 502 abutting the metal sheet 500. The method 400 includes exposing the photoresist using a lead frame pattern and ultraviolet (UV) light (404). FIG. 5B depicts a patterned mask 504 and light 506 exposing targeted areas of the photoresist layer 502 in accordance with the pattern of the patterned mask 504. In the example of FIG. 5B, areas 508 are exposed.

Figure 5C:
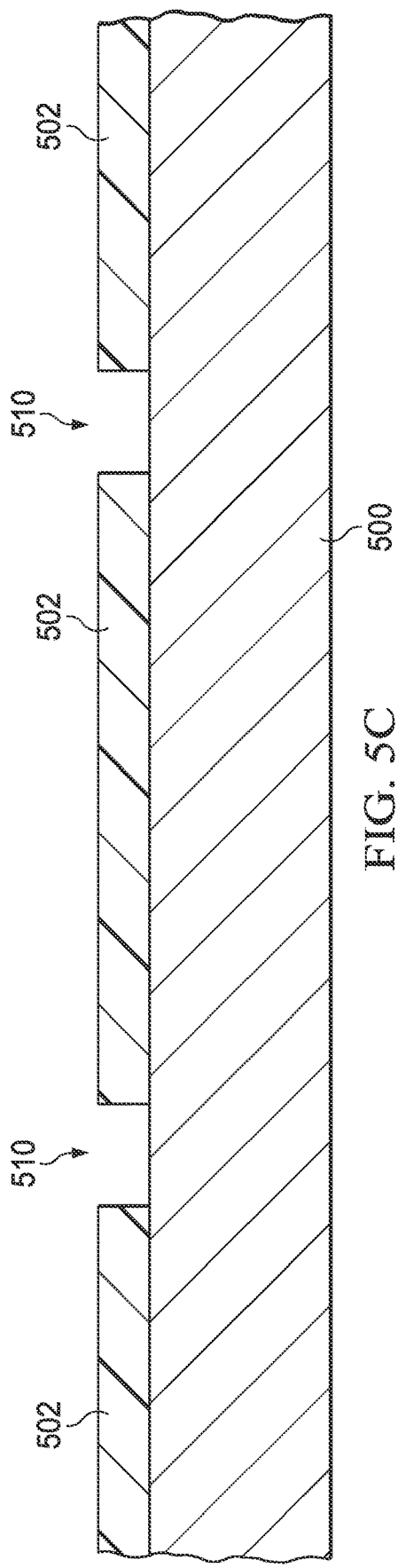
Figure 5D:
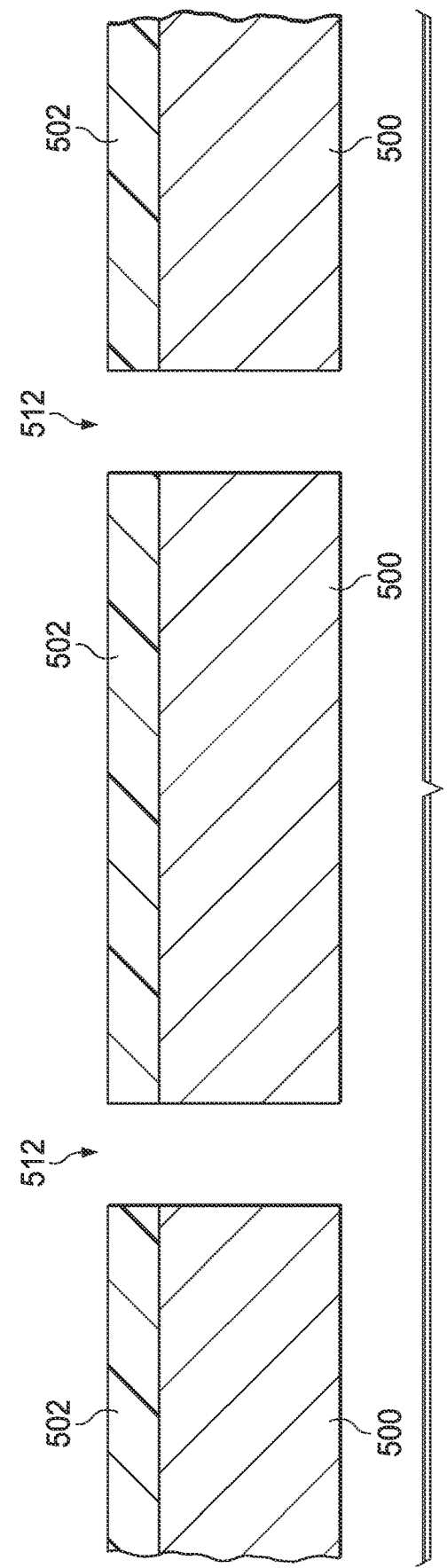
Figure 5E:
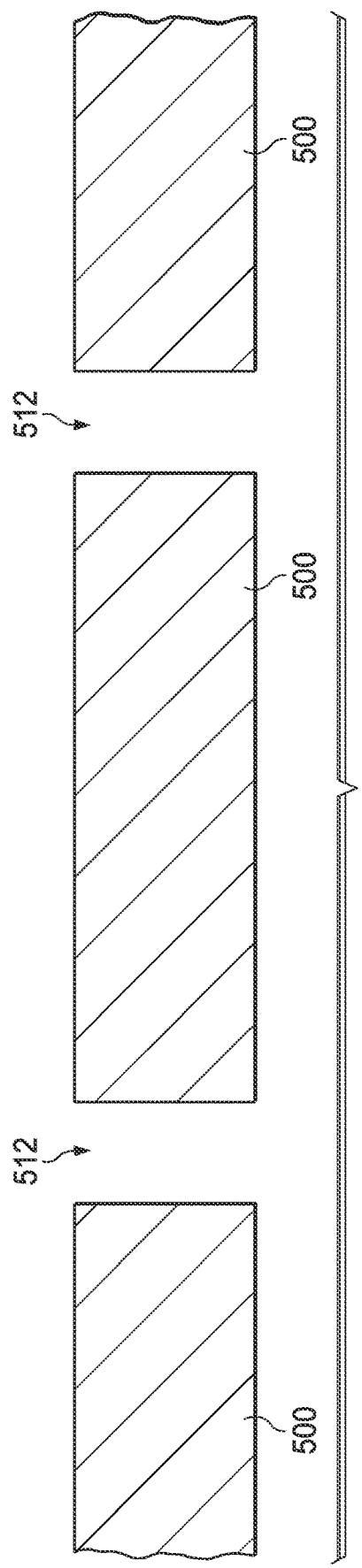
Figure 5F:
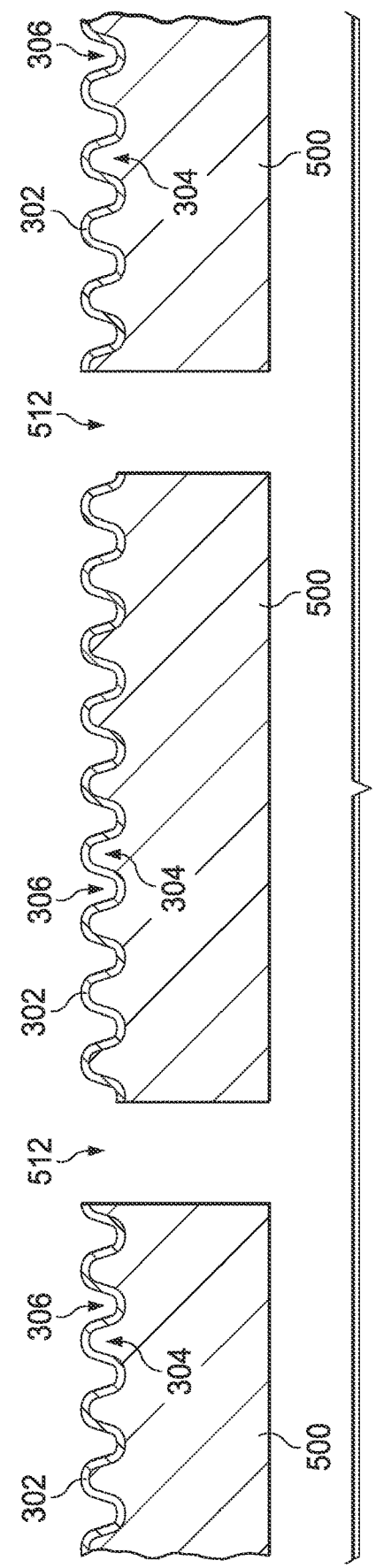
Figure 5G:
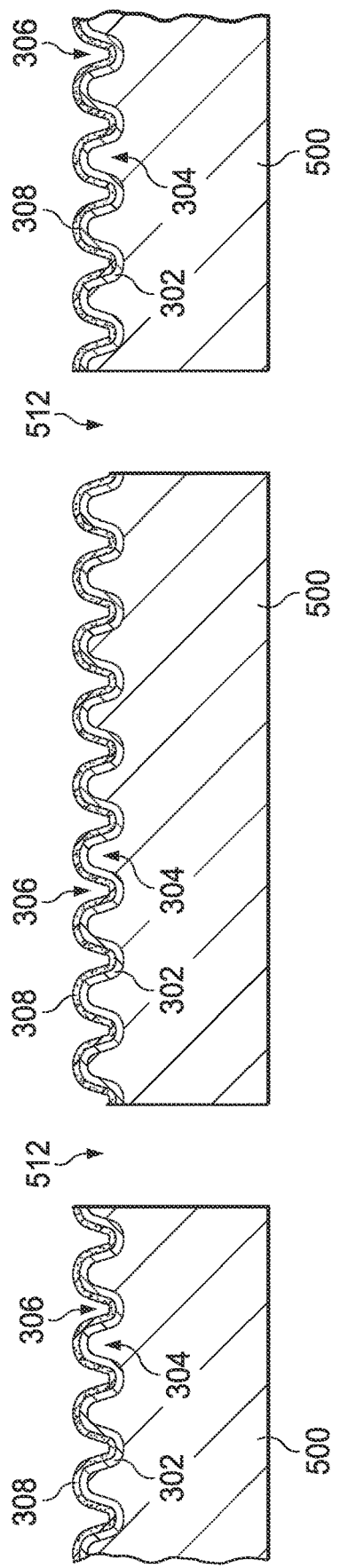

The method 400 includes developing and removing the exposed areas of the photoresist layer (406). FIG. 5C shows orifices 510 formed by developing and removing the exposed areas 508 of FIG. 5B. The method 400 includes etching the metal sheet through the orifices 510 (408). FIG. 5D shows orifices 512 that extend through both the photoresist layer 502 and the metal sheet 500. The method 400 includes removing the photoresist (410), as FIG. 5E shows. The method 400 includes roughening surfaces of the metal sheet (412), as FIG. 5F shows. Specifically, FIG. 5F shows the metal sheet 500, divided into multiple portions, having roughened surfaces 302, including protrusions 304 and orifices 306. The method 400 includes covering the roughened surfaces with anti-tarnish chemical coats (414). FIG. 5G shows the anti-tarnish chemical coats 308 abutting the roughened surface 302, as described in detail above. The anti-tarnish chemical coats 308 may be applied using the techniques described above. Although all portions of the metal sheet 500 are shown as being covered by an anti-tarnish chemical coat 308, in some examples, only the leads are covered by an anti-tarnish chemical coat 308, and the die pad (e.g., the center portion of the metal sheet 500 in FIG. 5G) remains uncovered by an anti-tarnish chemical coat 308. The method 400 then includes completing the lead frame manufacturing process (416). For example, the metal sheet 500 may be singulated into lead frame strips, a downset may be applied, the lead frame strips may be taped, the lead frame strips may be packaged for shipping, etc. During the subsequent manufacture of a semiconductor package, a die pad and leads from the lead frame strip may be incorporated into the semiconductor package as described above. Specifically, the die pad and leads with roughened surfaces 302 may be coupled to a semiconductor die, bond wires, etc. (418). As described above, when subjected to high temperatures (e.g., in excess of 200 degrees C.) during the wirebonding process such as a thermosonic wirebonding process, the anti-tarnish chemical coat 308 decomposes, and when ultrasonic and mechanical energy are applied, the anti-tarnish chemical coat 308 sloughs off the roughened surfaces 302 (418). A mold compound is then applied, and the resulting semiconductor package is singulated from other semiconductor packages (420).

Figure 6:
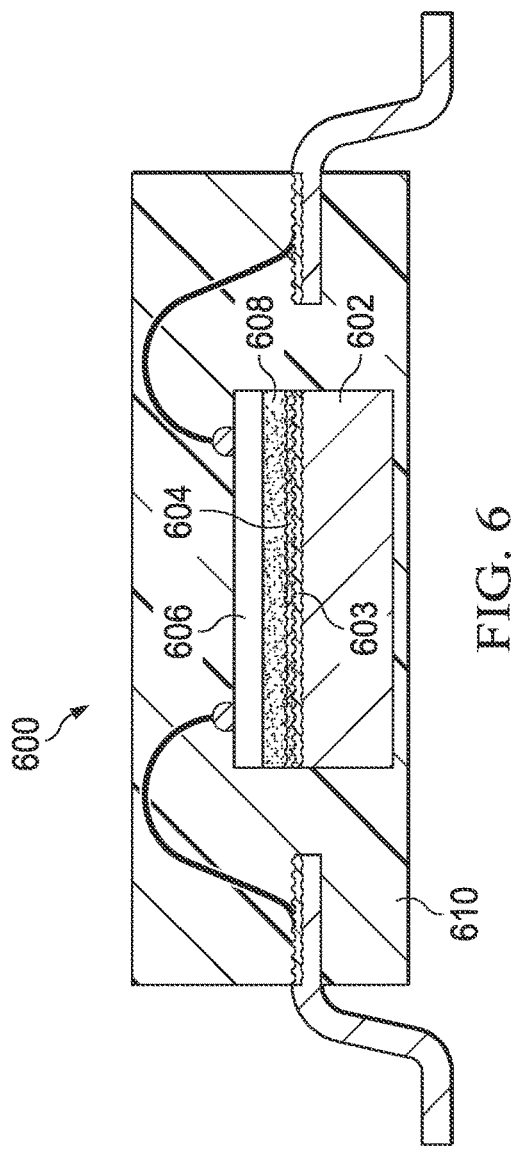
FIG. 6 is a profile cross-sectional view of a semiconductor package in accordance with examples.

As described above, in some examples, the anti-tarnish chemical coat is applied to a die pad as well as to leads. During the wirebonding process, the mechanical, thermal, and ultrasonic energy associated with a thermosonic or other appropriate bonding process may cause the anti-tarnish chemical coat to decompose and slough off of the leads. However, because a semiconductor die may be coupled to the die pad prior to the wirebonding process, the anti-tarnish chemical coat may remain on some or all of the die pad, even after the wirebonding process is complete. For example, a completed semiconductor package may include an anti-tarnish chemical coat on a roughened surface of the die pad, between the die pad and the semiconductor die. FIG. 6 is an example of a semiconductor package 600 including a die pad 602 having a roughened surface 603 (such as the roughened surfaces described above), an anti-tarnish chemical coat 604 abutting the roughened surface 603 of the die pad 602, and a semiconductor die 606 coupled to the anti-tarnish chemical coat 604 by way of a die attach layer 608. The roughened surface 603 has a roughness ranging from an arithmetic mean surface height (SA) of 1.4 to 3.2. In examples, the anti-tarnish chemical coat 604 follows a topography of the roughened surface 603. In examples, the semiconductor package 600 lacks a precious metal plating between the die pad 602 and the semiconductor die 606. In examples, a mold compound 610 covers at least the semiconductor die 606. Other components, including leads, bond wires, etc., may be included in the semiconductor package 600.

The term "couple" is used throughout the specification. The term may cover connections, communications, or signal paths that enable a functional relationship consistent with the description of this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Furthermore, a circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Unless otherwise stated, "about," "approximately," or "substantially" preceding a value means +/− 10 percent of the stated value. Modifications are possible in the described examples, and other examples are possible, within the scope of the claims.

What is claimed is:

1. A semiconductor package, comprising:
   a die pad;
   a semiconductor die on the die pad;
   a mold compound covering the die pad and the semiconductor die;
   a conductive component including a roughened surface, the roughened surface having a roughness ranging from an arithmetic mean surface height (SA) of 1.4 to 3.2, the mold compound coupled to the roughened surface; and
   a bond wire coupling the semiconductor die to the roughened surface, the bond wire directly coupled to the roughened surface without a precious metal positioned therebetween.

2. The semiconductor package of claim 1, wherein at least some of the mold compound is positioned within an orifice in the roughened surface.

3. The semiconductor package of claim 1, wherein the bond wire fills an orifice in the roughened surface and covers a protrusion of the roughened surface.

4. The semiconductor package of claim 1, wherein the roughened surface is an etched surface.

5. The semiconductor package of claim 1, wherein the roughened surface is a copper-plated surface.

6. The semiconductor package of claim 1, wherein the roughened surface comprises copper.

7. The semiconductor package of claim 1, wherein the roughened surface comprises a copper-iron alloy.

8. A semiconductor package, comprising:
   a conductive component including a roughened surface having a roughness ranging from an arithmetic mean surface height (SA) of 1.4 to 3.2, the roughened surface including an orifice and a protrusion; and
   a bond wire directly coupled to the roughened surface, wherein a position of the bond wire fills the orifice and covers the protrusion without a precious metal positioned between the bond wire and the roughened surface.

9. The semiconductor package of claim 8, wherein the roughened surface is an etched surface.

10. The semiconductor package of claim 8, wherein the roughened surface is a copper-plated surface.

11. The semiconductor package of claim 10, wherein the conductive component comprises a copper-iron alloy.

12. A semiconductor package, comprising:
    a copper-iron alloy surface having a first etched or copper-plated area and a second etched or copper-plated area;
    a semiconductor die disposed over the first etched or copper-plated area;
    a mold compound covering the copper-iron alloy surface and filling an orifice in the first etched or copper-plated area; and
    a bond wire directly coupled to the second etched or copper-plated area without a precious metal positioned therebetween.

13. The semiconductor package of claim 12, wherein the first and second etched or copper-plated areas have a roughness ranging from an arithmetic mean surface height (SA) of 1.4 to 3.2.

14. A method for manufacturing a semiconductor package, comprising:
    coupling a semiconductor die to a die pad; and
    coupling a bond wire to the semiconductor die and to a roughened surface of a conductive component using a thermosonic technique including:
       applying heat to the roughened surface to cause an anti-tarnish chemical coat abutting the roughened surface to decompose;

causing the decomposed anti-tarnish chemical coat to slough off of the roughened surface using at least one of mechanical and ultrasonic energy; and causing the bond wire to adhere directly to the roughened surface without a precious metal positioned therebetween.

15. The method of claim 14, wherein the anti-tarnish chemical coat includes benzotriazole or an organic film.

16. The method of claim 14, wherein the anti-tarnish chemical coat follows a topography of the roughened surface.

17. A semiconductor package, comprising:
a die pad having a roughened surface with a roughness ranging from an arithmetic mean surface height (SA) of 1.4 to 3.2;
an anti-tarnish chemical coat abutting the roughened surface;
a semiconductor die on the anti-tarnish chemical coat; and
a mold compound covering the semiconductor die.

18. The semiconductor package of claim 17, wherein the semiconductor package lacks a precious metal plating between the die pad and the semiconductor die.

19. The semiconductor package of claim 17, wherein the anti-tarnish chemical coat follows a topography of the roughened surface.

20. The semiconductor package of claim 17, further comprising a lead having a plated or etched surface with a roughness ranging from an SA of 1.4 to 3.2.

* * * * *